US008274305B2

(12) United States Patent
Xie

(10) Patent No.: US 8,274,305 B2
(45) Date of Patent: Sep. 25, 2012

(54) LINEAR VOLTAGE GENERATING DEVICE FOR TESTING PERFORMANCE OF POWER SUPPLIES

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 290 days.

(21) Appl. No.: 12/764,076

(22) Filed: Apr. 20, 2010

(65) Prior Publication Data

US 2011/0156744 A1 Jun. 30, 2011

(30) Foreign Application Priority Data

Dec. 25, 2009 (CN) .......................... 2009 1 0312237

(51) Int. Cl.
*G01R 31/40* (2006.01)
*G01R 31/02* (2006.01)
*G01R 13/00* (2006.01)

(52) U.S. Cl. ........... 324/764.01; 324/762.01; 324/140 R

(58) Field of Classification Search .............. 324/140 R, 324/141–142, 140 D, 764.01–765.01
See application file for complete search history.

(56) References Cited

U.S. PATENT DOCUMENTS

| | | | | |
|---|---|---|---|---|
| 5,422,570 | A * | 6/1995 | Moreira | 324/177 |
| 5,982,160 | A * | 11/1999 | Walters et al. | 323/282 |
| 7,511,472 | B1 * | 3/2009 | Xia et al. | 324/142 |
| 7,872,481 | B1 * | 1/2011 | Goeke et al. | 324/754.23 |
| 8,159,205 | B1 * | 4/2012 | Latham et al. | 323/286 |
| 2005/0104616 | A1 * | 5/2005 | Cullen et al. | 324/772 |
| 2005/0184721 | A1 * | 8/2005 | Peterson | 324/117 R |
| 2006/0284636 | A1 * | 12/2006 | Wright | 324/765 |

* cited by examiner

*Primary Examiner* — Joshua Benitez Rosario
(74) *Attorney, Agent, or Firm* — Altis Law Group, Inc.

(57) ABSTRACT

A linear voltage generating device for testing performance of a power supply includes a comparator circuit, an analog to digital (A/D) conversion circuit, and an amplifier circuit. The comparator circuit is configured for receiving a pulse width modulation (PWM) signal, and comparing the PWM signal with a reference voltage to output a filtered PWM signal. The A/D conversion circuit is configured for receiving the filtered PWM signal, and converting the filtered PWM signal to a linear digital signal. The amplifier circuit is configured for receiving the linear digital signal, and outputting an amplified linear digital signal to an electric load electrically coupled to the power supply.

7 Claims, 2 Drawing Sheets

LINEAR VOLTAGE GENERATING DEVICE FOR TESTING PERFORMANCE OF POWER SUPPLIES

BACKGROUND

1. Technical Field

The present disclosure relates to voltage generating devices, and particularly to a linear voltage generating device for testing performance of a power supply.

2. Description of Related Art

Most electronic apparatuses are not equipped with internal power supply devices in order to save space and costs. Therefore, these electronic apparatuses require external power supplies. Computers are powered by power supplies, which are capable of converting alternating current into direct current. The reliability of power supplies is tested by comparing the input and output voltages of the power supplies. Over-current protection is an important test for determining the reliability of power supplies. The test is done by gradually increasing the output currents of the power supply and checking if they are within allowable limits. However, the above testing method requires manual adjustment of resistance of the load electrically coupled to the power supply and does not allow for accurate linear adjustment.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
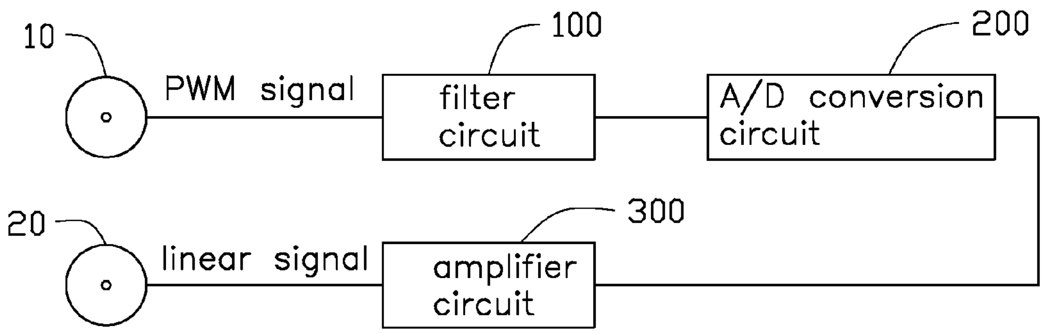
FIG. 1 is a block view of an embodiment of a linear voltage generating device for testing performance of power supplies.

Referring to FIG. 1, a device in an embodiment for testing performance of a power supply (not shown), includes a comparator circuit 100, an analog to digital (A/D) conversion circuit 200, and an amplifier circuit 300. The comparator circuit 100 is configured for receiving a pulse width modulation (PWM) signal from a signal input terminal 10, and comparing the PWM signal with a reference voltage to output a filtered PWM signal. The A/D conversion circuit 200 is configured for receiving the filtered PWM signal, and converting the filtered PWM signal to a linear digital signal. The amplifier circuit 300 is configured for receiving the linear digital signal, and outputting an amplified linear digital signal.

Figure 2:
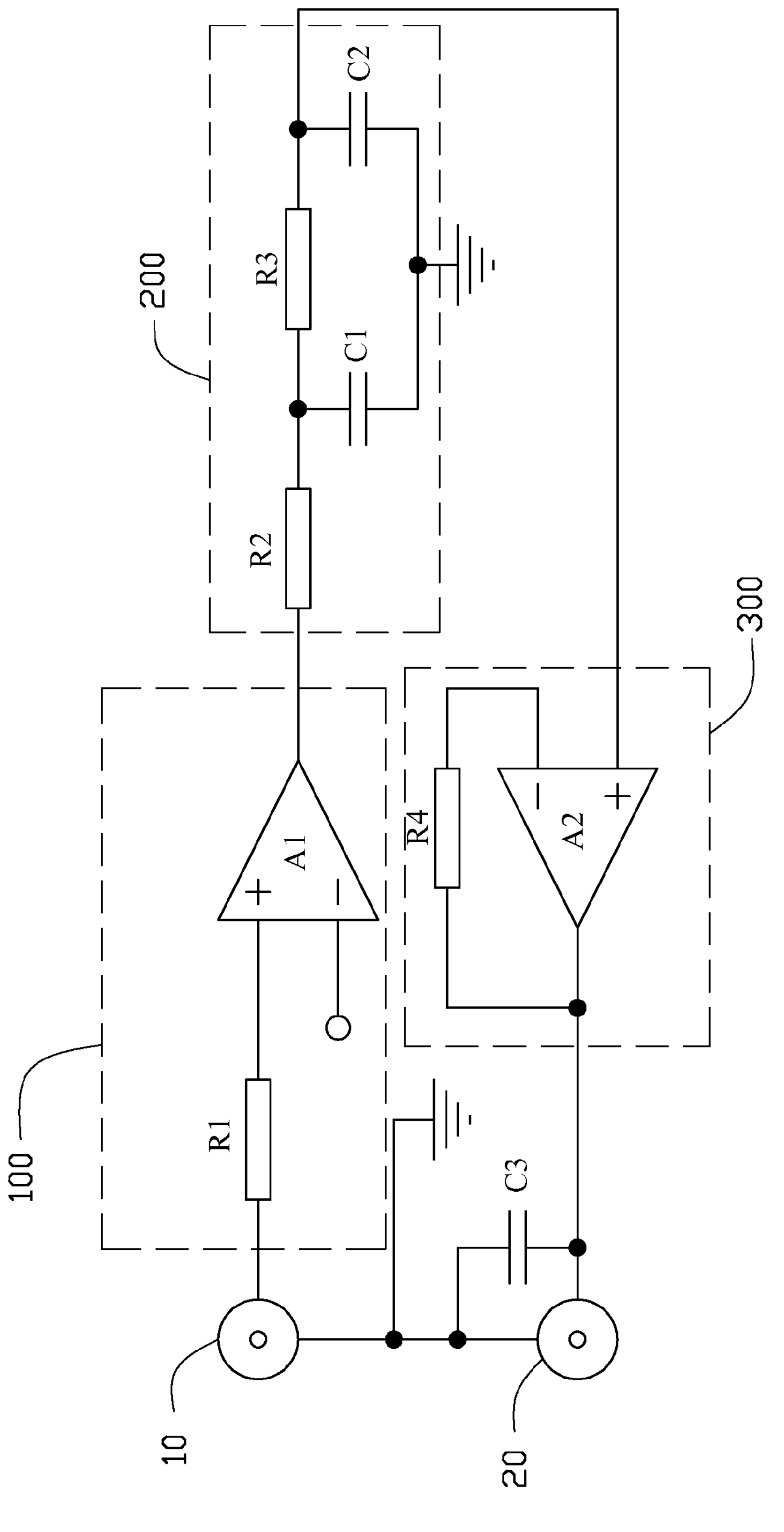
FIG. 2 is a circuit view of the linear voltage generating device for testing performance of power supplies of FIG. 1.

Referring to FIG. 2, the comparator circuit 100 includes a first amplifier A1, and a first resistor R1. The first amplifier A1 non inverting input terminal is capable of receiving the PWM signal via the first resistor R1. The first amplifier A1 inverting input terminal is capable of receiving the reference voltage. The first amplifier A1 output terminal is capable of outputting the PWM signal when the PWM signal is greater than the reference voltage. In this embodiment, the reference voltage is 2.5 volts.

The A/D conversion circuit 200 includes second resistor R2, third resistor R3, first capacitor C1 and second capacitor C2. The first resistor R2 first terminal is electrically coupled to the first amplifier A1 output terminal. The second resistor R2 second terminal is electrically coupled to the third resistor R3 and first capacitor C1 first terminals. The third resistor R3 second terminal is grounded via the second capacitor C2. The first capacitor C1 second terminal is grounded. A connection point between the third resistor R3 and the second capacitor C2 is capable of outputting the linear digital signal.

The amplifier circuit 300 includes a second amplifier A2 and a fourth resistor R4. The second amplifier A2 non inverting input terminal is electrically coupled to the connection point between the third resistor R3 and the second capacitor C2. The second amplifier A2 inverting input terminal is electrically coupled to the second amplifier A2 output terminal via the fourth resistor R4. The second amplifier A2 output terminal is grounded via a third capacitor C3. The second amplifier A2 output terminal is capable of outputting the amplified linear digital signal. The signal input and output terminals 10, 20 are grounded. The signal output terminal 20 is capable of being coupled to an electric load (not shown). The electric load is capable of being coupled to the power supply.

In operation, the signal input and output terminals 10, 20 are electrically coupled to the generating device as shown in FIG. 1. The comparator circuit 100 only outputs the PWM signals when the PWM signals are greater than the 2.5 volts reference voltage. As such, noise signals less than the 2.5 volts reference voltage are filtered. The A/D conversion circuit 200 is capable of converting the filtered PWM signals to linear digital voltages. The second amplifier A2 and fourth resistor R4 consist of a voltage follower circuit. A voltage level of the second amplifier A2 output terminal is equal to that of the second amplifier A2 non inverting input terminal. A current of the second amplifier A2 output terminal is amplified. Therefore, the linear performance of the digital voltage signals is improved, and the loading capacity of the voltage signal is improved.

In operation, the signal input and output terminals 10, 20 are electrically coupled to the generating device as shown in FIG. 1. The filter circuit 100 only outputs the PWM signals when the PWM signals are greater than the 2.5 volts reference voltage. As such, noise signals less than the 2.5 volts reference voltage are filtered. The A/D conversion circuit 200 is capable of converting the filtered PWM signals to linear digital voltages. The amplifier A2 and resistor R4 consist of a voltage follower circuit. A voltage level of the amplifier A2 output terminal is equal to that of the amplifier A2 non inverting input terminal A current of the amplifier A2 output terminal is amplified. Therefore, the linear performance of the digital voltage signals is improved, and the loading capacity of the voltage signals is also improved.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A linear voltage generating device for testing performance of a power supply, comprising:

a comparator circuit for receiving a pulse width modulation (PWM) signal, and comparing the PWM signal with a reference voltage to output a filtered PWM signal;

an analog to digital (A/D) conversion circuit for receiving the filtered PWM signal, and converting the filtered PWM signal to a linear digital signal; and an amplifier circuit for receiving the linear digital signal, and outputting an amplified linear digital signal to an electric load electrically coupled to the power supply; wherein the amplifier circuit comprises a second amplifier, and a fourth resistor; a non inverting input terminal of the second amplifier is adapted to receive the linear digital signal; an inverting input terminal of the second amplifier is electrically coupled to an output terminal of the second amplifier via the fourth resistor; the second amplifier output terminal is adapted to output the amplified linear digital signal; a voltage level of the second amplifier output terminal is equal to a voltage level of the second amplifier non inverting input terminal; and a current of the second amplifier output terminal is amplified.

2. The device of claim 1, wherein the comparator circuit comprises a first amplifier, and a first resistor; a non inverting input terminal of the first amplifier is capable of receiving the PWM signal via the first resistor; an inverting input terminal of the first amplifier is capable of receiving the reference voltage; an output terminal of the first amplifier is capable of outputting the PWM signal greater than the reference voltage.

3. The device of claim 2, wherein the reference voltage is 2.5 volts.

4. The device of claim 3, wherein the A/D conversion circuit comprises a second resistor, a third resistor, a first capacitor, and a second capacitor; the second resistor first terminal is electrically coupled to the first amplifier output terminal; the second resistor second terminal is electrically coupled to the third resistor and first capacitor first terminals; the third resistor second terminal is grounded via the second capacitor; the first capacitor second terminal is grounded; a connection point between the third resistor and the second capacitor is capable of outputting the linear digital signal.

5. The device of claim 1, further comprising a third capacitor; the second amplifier output terminal is grounded via the third capacitor.

6. The device of claim 2, further comprising a signal input terminal for outputting the PWM signal; the signal input terminal is grounded, and is electrically coupled to the first amplifier non inverting input terminal via the first resistor.

7. The device of claim 5, further comprising a signal output terminal for outputting the amplified linear digital signal; the signal output terminal is grounded, and is electrically coupled to the second amplifier output terminal.

* * * * *